(12) United States Patent
Neveu

(10) Patent No.: US 11,870,448 B2
(45) Date of Patent: Jan. 9, 2024

(54) ADJUSTABLE PHASE LOCKED LOOP

(71) Applicant: TEXAS INSTRUMENTS INCORPORATED, Dallas, TX (US)

(72) Inventor: Florian Neveu, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 29 days.

(21) Appl. No.: 17/730,205

(22) Filed: Apr. 27, 2022

(65) Prior Publication Data

US 2023/0095293 A1  Mar. 30, 2023

Related U.S. Application Data

(60) Provisional application No. 63/246,413, filed on Sep. 21, 2021.

(51) Int. Cl.
*H03L 7/093* (2006.01)
*H03L 7/089* (2006.01)
*H03L 7/099* (2006.01)

(52) U.S. Cl.
CPC ............ *H03L 7/093* (2013.01); *H03L 7/0893* (2013.01); *H03L 7/099* (2013.01)

(58) Field of Classification Search
CPC . H03L 7/093; H03L 7/099; H03L 1/00; H03L 5/00
See application file for complete search history.

(56) References Cited

U.S. PATENT DOCUMENTS

| | | | |
|---|---|---|---|
| 7,382,849 B1 * | 6/2008 | Groe | H03L 7/0896 375/376 |
| 9,837,960 B2 * | 12/2017 | Takada | H02M 3/07 |
| 10,396,806 B1 * | 8/2019 | Chang | H03H 7/06 |

* cited by examiner

*Primary Examiner* — Diana J. Cheng
(74) *Attorney, Agent, or Firm* — Ray A. King; Frank D. Cimino

(57) ABSTRACT

In described examples, a phase locked loop (PLL) includes a compensation circuit, a transconductance circuit, and an oscillator. The compensation circuit includes a capacitor circuit and a resistive element having a resistance responsive to a center frequency of the PLL's bandwidth. The transconductance circuit includes a current source and an error amplifier. The current source generates a current responsive to the center frequency. The error amplifier has a transconductance responsive to the center frequency, and receives a signal responsive to the resistance and a difference between an input clock signal and a feedback signal. The oscillator input is coupled to the error amplifier output. The oscillator provides a signal at its output for generating the feedback signal.

20 Claims, 6 Drawing Sheets

ADJUSTABLE PHASE LOCKED LOOP

CROSS REFERENCE

This application claims the benefit, and is a non-provisional, of U.S. Provisional Patent Application No. 63/246,413, filed Sep. 21, 2021, which is incorporated herein by reference.

TECHNICAL FIELD

This application relates generally to phase locked loops, and more particularly to adjusting a phase locked loop during frequency change events.

BACKGROUND

A phase locked loop (PLL) uses signal phase comparisons between a feedback signal and a signal with a frequency indicating a target frequency to adjust an oscillator to output a signal matching the target frequency. In some examples, a PLL is manufactured as part of an integrated circuit (IC). During steady state operation, a PLL outputs a signal with a constant tone matching, meaning being in phase with, the target frequency. In some examples, the target frequency can change, such as when a PLL synchronizes with an external clock, for instance a clock external to an IC that includes the PLL. PLLs take time to adjust their oscillator from stably producing an output signal matching a first target frequency to stably producing an output signal matching a second target frequency.

SUMMARY

In described examples, a phase locked loop (PLL) includes a compensation circuit, a transconductance circuit, and an oscillator. The compensation circuit includes a capacitor circuit and a resistive element having a resistance responsive to a center frequency of the PLL's bandwidth. The transconductance circuit includes a current source and an error amplifier. The current source generates a current responsive to the center frequency. The error amplifier has a transconductance responsive to the center frequency, and receives a signal responsive to the resistance and a difference between an input clock signal and a feedback signal. The oscillator input is coupled to the error amplifier output. The oscillator provides a signal at its output for generating the feedback signal.

DETAILED DESCRIPTION

Figure 1:
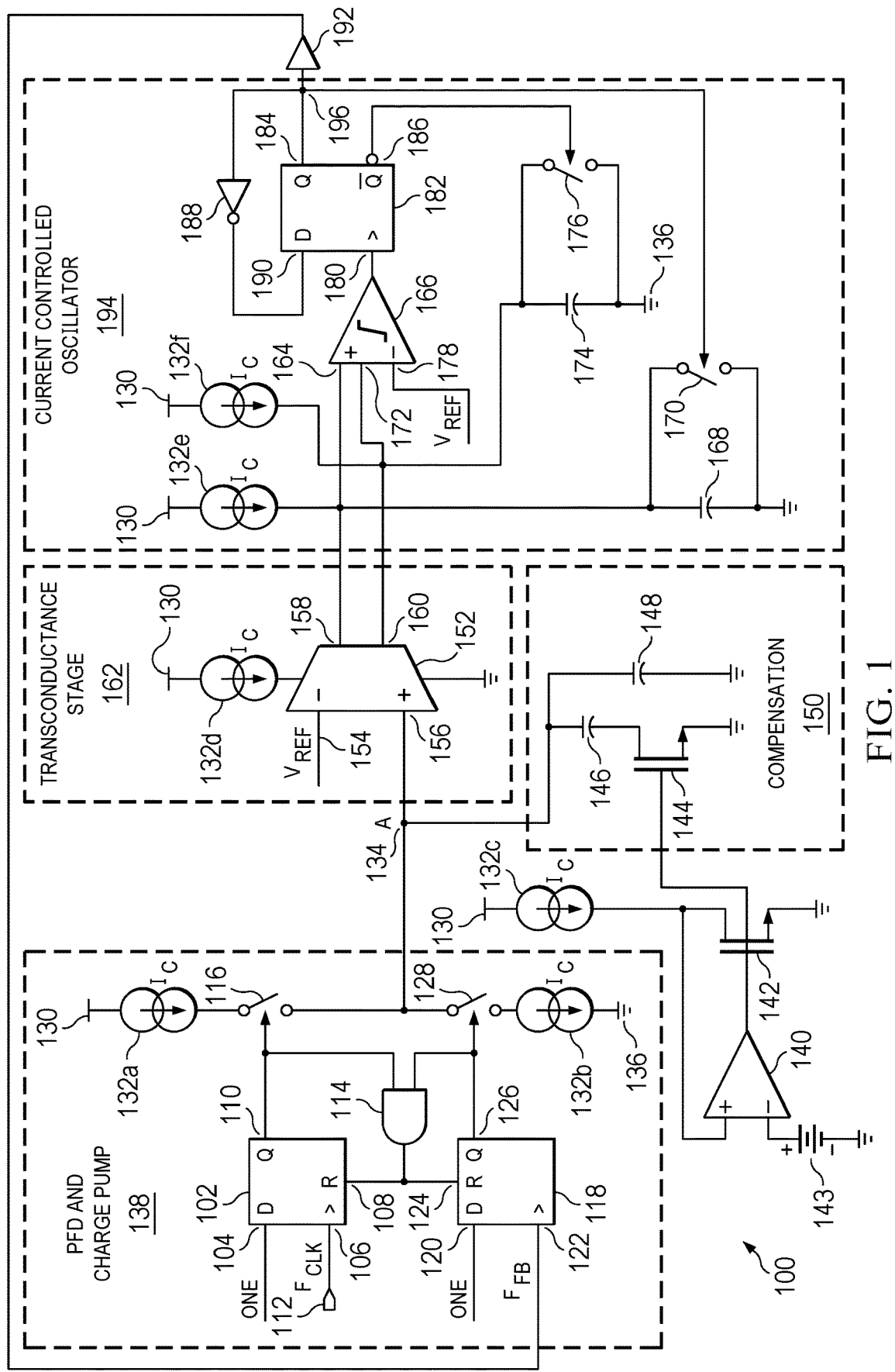
FIG. 1 shows a circuit diagram of an example PLL.

When an input clock or frequency reference of a PLL changes to a different frequency within a bandwidth of the PLL, such as when the input clock of the PLL is synchronized to an external clock signal, the PLL changes its output frequency in response. An example PLL 100 is shown in a circuit diagram of FIG. 1. PLL 100 includes a phase frequency detector (PFD) and charge pump (CP) 138, a transconductance stage 162, a compensation circuit 150, and a current controlled oscillator 194. FIG. 1 further shows a high gain operational amplifier (high gain op amp) 140, a first n-channel MOSFET (NMOS FET) 142, a center-frequency dependent current source 132c, an input voltage terminal 130, and an electrical ground, or simply ground, 136. The PLL 100 receives an input voltage at the input voltage terminal 130. In some examples, each of the described components of the PLL 100 is included on a same piece of silicon (die). In some examples, one or more of the PFD and CP 138, the transconductance stage 162, the compensation circuit 150, the current controlled oscillator 194, the high gain op amp 140, the first NMOS FET 142, and the center-frequency dependent current source 132c are included on multiple dies, or different ones of the described components are not on the same die.

The PFD and CP 138 includes first and second DFFs 102 and 118, an input clock 112, an AND logic gate 114, center-frequency dependent current source(s) 132a and 132b, and first and second charge pump switches 116 and 128. The transconductance stage 162 includes a current source 132d and an error amplifier 152. The compensation circuit 150 includes a second NMOS FET 144 and first and second compensation capacitors 146 and 148. First and second compensation capacitors 146 and 148 form a capacitor circuit. The current controlled oscillator 194 includes center-frequency dependent current sources 132e and 132f, first and second ramp capacitors 168 and 174, first and second ramp switches 170 and 176, a comparator 166, a third DFF 182, and an inverter 188. The DFF 182 and inverter 188 are collectively referred to herein as a first switch control circuit.

The PLL 100 is configured to change its output signal frequency at a rate that is a fraction per input clock cycle of a target output signal frequency of the PLL 100. Within a bandwidth of the PLL 100, this fraction is constant with respect to a given phase difference $\phi$ between an input clock signal, e.g., 302, and a feedback signal, e.g., 304 (FIG. 3A) that corresponds to or is taken or derived from the output signal. This fraction is also constant with respect to a given proportional difference between a center frequency $F_C$ of the bandwidth of the PLL 100 and a target output signal frequency of the PLL 100. A center-frequency dependent current $I_C$ generated using a voltage $V_C$ across a resistor (not shown in FIG. 1) having a user-definable resistance $R_C$ sets the center frequency $F_C$ of the PLL 100 (see, for example, resistor 208 of FIG. 2). A frequency of the input clock signal 302 provides, or is used to determine, the target output signal frequency of the PLL 100.

A charge pump charges and discharges a node A 134 with current $I_C$, using center-frequency dependent current sources 132a and 132b. A positive or negative charge received by the node A 134 and corresponding voltage $V_A$ at node A 134, and a rate of charge or discharge of node A 134, are dependent on the phase difference $\phi$ between the input clock signal 302 and the feedback signal 304. A rate of charge of node A 134 is made further dependent on $F_C$ using the compensation network 150, which includes an $R_C$ filter having a center-frequency dependent resistance $R_C$. $R_C$ is a pseudo-resistance of a metal oxide semiconductor field effect transistor 144 operating in linear/ohmic operation mode.

The error amplifier 152 has a center-frequency dependent transconductance $g_m$. The transconductance stage 162 converts the center-frequency dependent voltage $V_A$ at node A 134 into a current $I_{gm}$ dependent on the center-frequency dependent transconductance $g_m$ of the error amplifier 152. The transconductance stage 162 output current $I_{gm}$, along with center-frequency dependent current sources 132e and 132f ($I_C$), charge respective ramp capacitors 168 and 174. The rate of charge of the ramp capacitors 168 and 174 controls the output signal frequency of the current controlled oscillator 194, which generates the output signal of the PLL 100 and provides the output signal to an output terminal 196. The output terminal 196 can connect to other circuitry outside the PLL 100, such as the functional block 226. The output signal of the current controlled oscillator 194 also provides the feedback signal 304 of the PLL 100.

In some examples, synchronizing the PLL 100 to a frequency of an external clock can improve control of electromagnetic interference. Synchronizing the PLL 100 to a frequency of an external clock can also, for example, enable or facilitate multiple power converters operating at the same frequency, spread spectrum modulation, or frequency hopping in signal transmission or reception.

As further illustrated in FIG. 1, the first D flip flop (DFF) 102 has a first data input (D) 104, a first clock input (>) 106, a first reset (or clear) input (R) 108, and a first DFF output (Q) 110. A D flip flop changes output state between voltages corresponding to logical zero and logical one in response to a data input state and an edge, for example, a rising edge, of a clock signal. In some examples, the first data input 104 receives a constant signal with a voltage corresponding to a logical one. The first clock input 106 is connected to an input clock terminal 112, which provides the clock signal 302 (FIG. 3A) at a frequency $F_{CLK}$. The first DFF output 110 is connected to a first input of the AND logic gate 114 and to a control terminal of the first charge pump switch 116. The output signal at the first DFF output 110 controls the opening and closing of the first charge pump switch 116. The clock signal 302 acts as a frequency reference signal for the PLL 100, in which $F_{CLK}$ is a reference frequency for the PLL 100.

The second DFF 118 has a second data input (D) 120, a second clock input (>) 122, a second reset input (R) 124, and a second DFF output (Q) 126. In some examples, the second data input 120 receives a constant signal with a voltage corresponding to a logical one. The second clock input 122 is connected to an output of a buffer 192 to receive the feedback signal 304 with frequency $F_{FB}$. The second clock input 122 is connected via the buffer 192 to a third DFF output 184 of a third DFF 182, as further described below. The second DFF output 126 is connected to a second input of the AND logic gate 114 and to a control terminal of the second charge pump switch 128. The output signal at the second DFF output 126 controls the opening and closing of the second charge pump switch 128. An output of the AND logic gate 114 is connected to the first reset input 108 and the second reset input 124. The clock signal 302 and the feedback signal 304, and control signals for the first and second charge pump switches 116 and 128 (output signals of the first and second DFFs 102 and 118, respectively) are further discussed with respect to FIG. 3A.

A center-frequency dependent current source 132 includes, for example, multiple metal-oxide-semiconductor field-effect transistors (MOSFETs) configured to act as current mirrors to a MOSFET used to generate the center-frequency dependent current. Accordingly, the multiple instances of the center-frequency dependent current source 132 appearing in FIG. 1 are treated as separate, but are labelled 132a, 132b, 132c, etc., to indicate their connected origin. For example, different item numbers 132a and 132b correspond to two different current mirror MOSFETs, each separately outputting the same center-frequency dependent current. The center-frequency dependent current source 132 outputs the center-frequency dependent current $I_C$, which is generated using, e.g., is dependent on, the center frequency $F_C$ of the bandwidth of the PLL 100, such that $I_C=m\times F_C$, where m is a constant. For example, m equals 1 µA per 0.5 MHz. The center frequency of the bandwidth of the PLL 100 is further discussed with respect to the transconductance stage 162 and the current controlled oscillator 194, and with respect to FIGS. 2 and 5.

The input voltage terminal 130 is connected to an input of the center-frequency dependent current source 132a. Center-frequency dependent current source 132a, like the other center-frequency dependent current sources 132 of the PLL 100, is configured to provide the center-frequency dependent current $I_C$. $I_C$ increases with increasing center frequency $F_C$ of the bandwidth of the PLL 100, and decreases with decreasing $F_C$. An output of the center-frequency dependent current source 132a is connected to a first terminal of the first charge pump switch 116. A second terminal of the first charge pump switch 116 is connected to a first terminal of the second charge pump switch 128, as well as to node A 134. Node A 134 has voltage $V_A$. A second terminal of the second charge pump switch 128 is connected to an input of the center-frequency dependent current source 132b. An output of the center-frequency dependent current source 132b is connected to ground 136.

The input voltage terminal 130 is also connected to an input of the center-frequency dependent current source 132c. An output of the center-frequency dependent current source 132c is connected to a non-inverting input of the high gain op amp 140 and to a drain of the first NMOS FET 142. An inverting input of the high gain op amp 140 is connected to a positive terminal of the constant voltage source 143. The voltage source 143 is configured to output a constant voltage $V_{CONSTANT}$ as a reference for the high gain op amp 140. A negative terminal of the constant voltage source 143 is connected to ground 136. An output of the high gain op amp 140 is connected to the gate of the first NMOS FET 142 and the gate of the second NMOS FET 144. A source of the first NMOS FET 142 is connected to ground 136. A voltage at the drain of the first NMOS FET 142 is used as a feedback voltage for the high gain op amp 140.

A source of the second NMOS FET 144 is connected to ground 136. A drain of the second NMOS FET 144 is connected to a first conductor (e.g., a cathode plate), e.g., via a first terminal, of a first compensation capacitor 146. In some examples, the capacitor 146 is a polarized capacitor. A second conductor (e.g., an anode plate), e.g., via a second terminal, of the first compensation capacitor 146 is connected to an anode plate of a second compensation capacitor 148 and to node A 134. In some examples, the capacitor 148 is a polarized capacitor. A cathode plate of the second compensation capacitor 148 is connected to ground 136. Together, the second NMOS FET 144 and the first and second compensation capacitors 146 and 148, of the compensation network 150, are configured to act as a low pass filter and to contribute a zero and a pole to the transfer function for the PLL 100. In some examples, the first and second compensation capacitors 146 and 148 are high frequency capacitors. Also, anode and cathode plates of capacitors are generally referred to herein and analogous to first and second conductors that may be coupled or connected via a respective terminal to other electrical components or elements.

The error amplifier 152 has an inverting input 154 connected to a reference voltage source (not shown), to receive a voltage reference signal having a reference voltage $V_{REF}$. A non-inverting input 156 of the error amplifier 152 is connected to node A 134. A differential voltage received in the transconductance stage 162 equals the voltage received by the non-inverting input 156 minus the voltage received by the inverting input 154. This differential voltage corresponds to the voltage at node A 134 $V_A$ minus the reference voltage $V_{REF}$. The input voltage terminal 130 is also connected to an input of the center-frequency dependent current source 132d. A power input of the error amplifier 152 is connected to an output of the center-frequency dependent current source 132d. The error amplifier 152 is also connected to ground 136. The error amplifier 152 has a first error amplifier output 158 and a second error amplifier output 160.

The error amplifier 152 generates two output signals having a same magnitude of DC current, on the first and second error amplifier outputs 158 and 160, respectively. The current source 132d and the error amplifier 152, of the transconductance stage 162, are configured to convert the differential voltage $V_A-V_{REF}$ to an output current $I_{gm}$. The error amplifier 152 of the transconductance stage 162 has a center-frequency dependent transconductance $g_m$ (dI/dV) that is related to the center-frequency dependent current $I_C$ as shown in Equation 1, where n is a constant:

$$g_m = n \times I_C.$$ Equation 1

For example, the center-frequency dependent transconductance $g_m$ of the error amplifier 152 is $8 \times I_C$ µS/µA (microsiemens per microampere). Also, the error amplifier 152 is configured to have center-frequency dependent limits on a range of possible output currents $I_{gm}$, as shown in Equation 2, where k is a constant that is less than one:

$$-k \times I_C \leq I_{gm} = k \times I_C.$$ Equation 2

Figure 5:
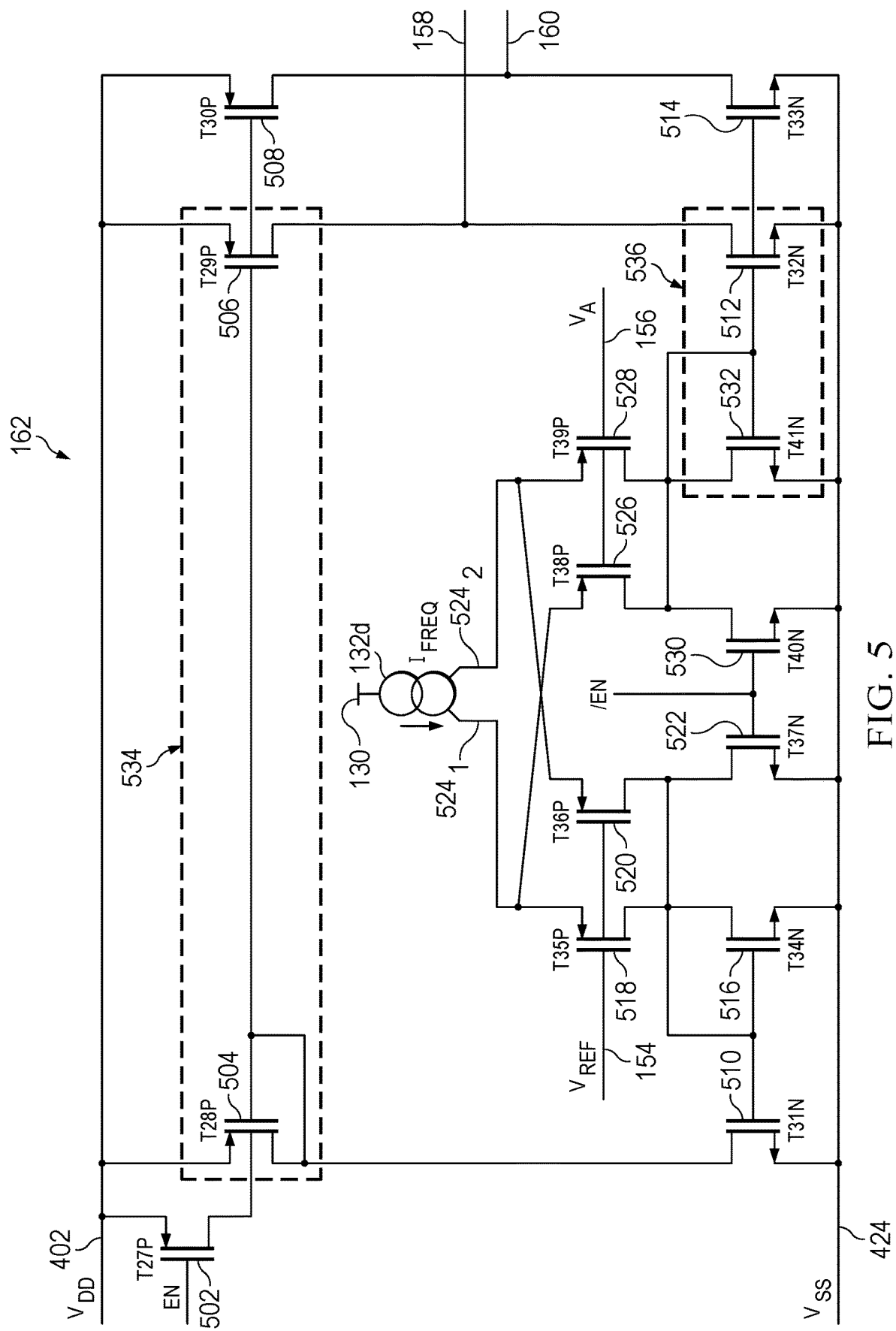
FIG. 5 shows a circuit diagram for an example transconductance stage for use in the PLL of FIG. 1.

The constant k is 0.5, for example, and can be adjusted as described with respect to FIG. 5. A relationship between the differential voltage $V_A-V_{REF}$ received in the transconductance stage 162 and the output current $I_{gm}$ of the transconductance stage 162 is linearized using, for example, transistors arranged as a differential pair operating in a weak inversion region. The transconductance stage 162 is further discussed with respect to FIG. 5.

An input of the center-frequency dependent current source 132e is connected to the input voltage terminal 130. An output of the center-frequency dependent current source 132e is connected to the first error amplifier output 158, a first non-inverting comparator input 164 of the comparator 166, an anode plate of the first ramp capacitor 168, and a first terminal of the first ramp switch 170. In some examples, the capacitor 168 is a polarized capacitor. A cathode plate of the first ramp capacitor 168 is connected to a second terminal of the first ramp switch 170 and to ground 136.

An input of the center-frequency dependent current source 132f is connected to the input voltage terminal 130. An output of the center-frequency dependent current source 132f is connected to the second error amplifier output 160, a second non-inverting comparator input 172 of the comparator 166, an anode plate of the second ramp capacitor 174, and a first terminal of the second ramp switch 176. In some examples, the capacitor 174 is a polarized capacitor. A cathode plate of the second ramp capacitor 174 is connected to a second terminal of the second ramp switch 176 and to ground 136.

The comparator 166 has an inverting input 178 connected to the reference voltage source (not shown). The inverting input 178 receives the voltage reference signal having the reference voltage $V_{REF}$ 316. The comparator 166 has an output connected to a clock input (>) 180 of the third DFF 182. The third DFF 182 has a non-inverting DFF output (Q) 184 and an inverting DFF output ($\overline{Q}$) 186. The non-inverting DFF output 184 is connected to the control terminal of the first ramp switch 170, an input of the inverter 188 and an input of the buffer 192. An output signal at the DFF output 184 controls the opening and closing of the switch 170. An output of the inverter 188 is connected to a data input (D) 190 of the third DFF 182. The inverting DFF output 186 is connected to the control terminal of the second ramp switch 176. An output signal of the DFF output 186 controls the opening and closing of the switch 176. An output of the buffer 192 is connected to the clock input 122 of the second DFF 118.

The third DFF 182 provides an output signal for the PLL 100 at the non-inverting DFF output 184. When the PLL 100 is operating in a steady state, the output signal for the PLL 100 has a frequency equal to the frequency $F_{CLK}$ of the input clock at the terminal 112. The buffer 192 provides a feedback signal 304 for the PLL 100 at its output. The feedback signal 304 has a feedback frequency $F_{FB}$.

The first DFF 102 is triggered to output a signal with a voltage corresponding to a logical one. The triggering is responsive to a rising edge of the clock signal 302 received at the input clock terminal 112. The second DFF 118 is triggered to output a signal with a voltage corresponding to a logical one. The triggering is responsive to a rising edge of the clock signal 302 received at the input clock terminal 122. If both the first DFF 102 and the second DFF 118 output a logical one, then the AND logic gate 114 outputs a signal with a voltage corresponding to a logical one to both the first reset input 108 and the second reset input 124. This causes both the first DFF 102 and the second DFF 118 to reset and no longer output respective logical one-valued signals. For example, the first DFF 102 and the second DFF 118 revert to outputting signals with voltages corresponding to logical zero, such as zero voltage signals.

Figure 2:
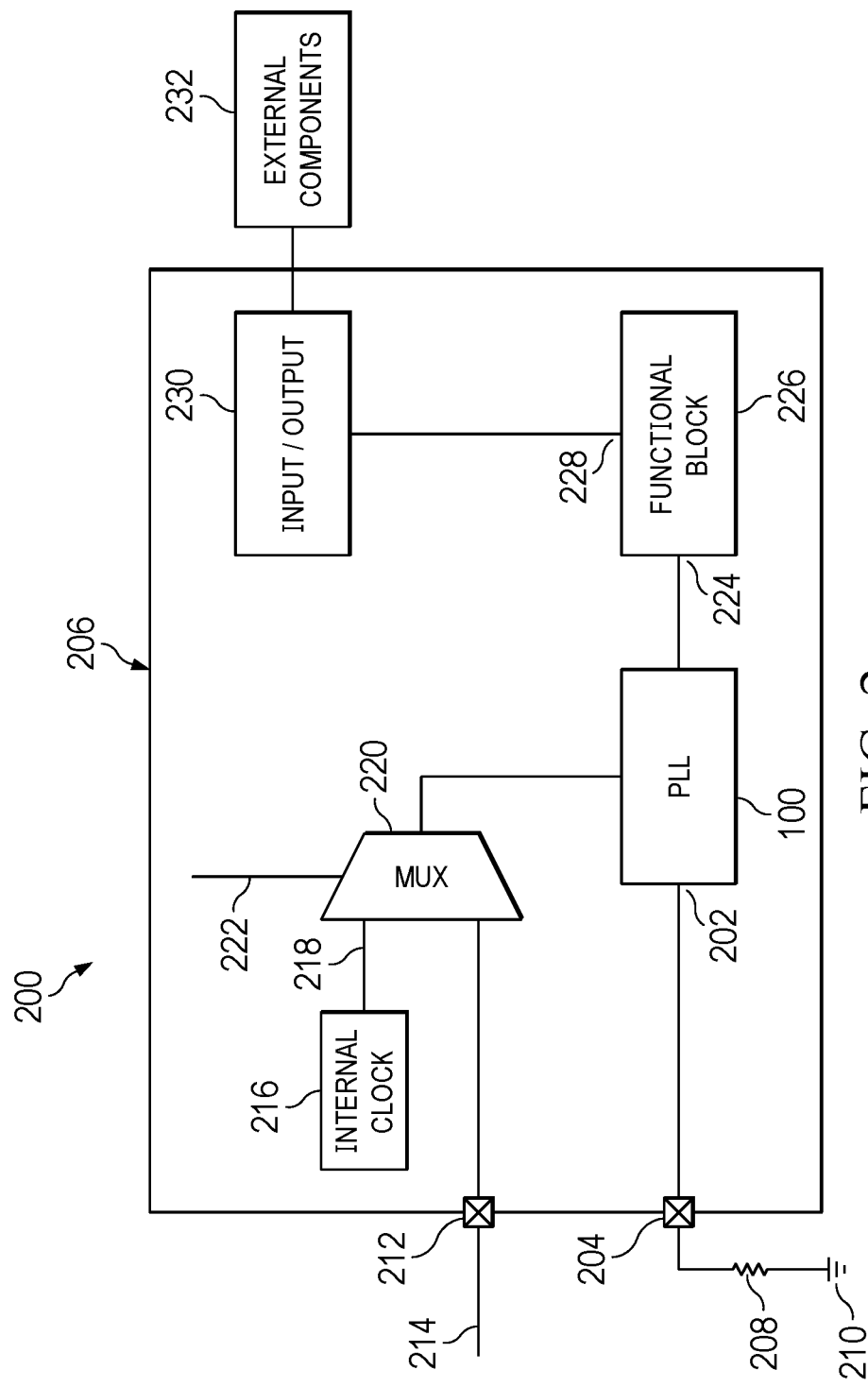
FIG. 2 shows a functional block diagram of an example system including the PLL of FIG. 1.

FIG. 2 shows a functional block diagram of an example system 200 including the PLL 100 of FIG. 1. System 200 includes the PLL 100, an internal clock 216, a multiplexer (MUX) 220, a functional block 226, and an input/output block 230, which are included on an IC 206 having input pins 204 and 212. System 200 further includes external components 232, a resistor 208, and an electrical ground, or simply ground, 210.

A control input 202 of the PLL 100 is connected to the first input pin 204. The first input pin 204 is connected to a first terminal of the resistor 208. A second terminal of the resistor 208 is connected to ground 210. The second input pin 212 receives an external clock signal 214. The internal clock 216 outputs an internal clock signal 218 to a first input of the MUX 220. The second input pin 212 is connected to a second input of the MUX 220. An output of the MUX 220 is connected to a clock input of the PLL 100 to provide the input clock to the input clock terminal 112. A control input 222 of the MUX 220 receives a selector signal that determines whether the MUX 220 outputs the internal clock signal 218 or the external clock signal 214.

An output of the PLL 100 is connected to a clock input 224 of the functional block 226. An output 228 of the functional block 226 is connected to the input/output (I/O) block 230 of the IC 206. In some examples, the functional block 226 can be included, with or without the I/O block 230, in a separate IC from an IC 206 that includes the PLL 100. The functional block 226 includes, for example, a power converter or a controller for a power converter (such as a buck-boost converter or another type of converter), a pulse width modulation controller, a pulse frequency modulation controller, or a transceiver. The I/O block 230 communicates externally to the IC 206 and is, thereby, connected to the external components 232.

The resistor 208 is used to select the center frequency $F_C$ of the operating frequency range (bandwidth) of the PLL 100. The PLL 100 is configured to provide a selected, constant voltage $V_C$ across the resistor 208, so that the center-frequency dependent current $I_C$ through the resistor 208 depends on the resistance R of the resistor 208. The center frequency $F_C$ of the PLL 100 is related to the current $I_C$ through the resistor 208 as shown in Equation 3, where m is a constant:

$$F_C = m'I_C \qquad \text{Equation 3}$$

Accordingly, $F_C = m \times V_C / R$. The operating frequency range of the PLL 100 is the frequency range within which the PLL 100 can stably lock to and output a signal at a target frequency. In some examples, the resistance R of the resistor 208 is programmable.

Returning to FIG. 1, if the first DFF 102 is activated (e.g., outputs a signal with a voltage corresponding to a logical one) prior to the second DFF 118 being activated, the first DFF output 110 activates the first CP switch 116, causing the first CP switch 116 to close. The first DFF 102 being activated prior to the second DFF 118 being activated correlates to the output frequency of the PLL 100 being less than the target frequency indicated by the clock signal 302, though this is not always the case. While the first CP switch 116 is closed, it conducts current from the voltage input terminal 130 to node A 134, via the center-frequency dependent current source 132a.

If the second DFF 118 is activated prior to the first DFF 102 being activated, the second DFF output 126 activates the second CP switch 128, causing the second CP switch 128 to close. The second DFF 118 being activated prior to the first DFF 102 being activated correlates to the output frequency of the PLL 100 being greater than the target frequency indicated by the clock signal 302, though this is not always the case. While the second CP switch 128 is closed, it conducts current from node A 134 to ground 136, via the center-frequency dependent current source 132b.

If the first and second DFFs 102 and 118 are concurrently activated, the output signal of the AND gate 114 at their respective reset inputs 108 and 124 deactivates the first and second DFFs 102 and 118. In this example, deactivating the first and second DFFs 102 and 118 causes them to, respectively, output a signal with a voltage corresponding to a logical zero. Responsive to the logical zero, the first and second CP switches 116 and 128 open and, thereby, cease conducting current. Accordingly, the first and second CP switches 116 and 128 are prevented from being closed and conducting at the same time. Signal timing for the first and second DFFs 102 and 118 and the first and second CP switches 116 and 128 is further discussed with respect to FIG. 3A, below.

The high gain op amp 140 outputs a bias voltage for the first NMOS FET 142. Because of the feedback from the drain of the first NMOS FET 142 to the non-inverting input of the high gain op amp 140, the bias voltage output by the high gain op amp 140 causes the voltage drop across the first NMOS FET 142 to equal the constant voltage $V_{CONSTANT}$ output by the constant voltage source 143. The first and second NMOS FETs 142 and 144 operate in a saturation region. Accordingly, the first NMOS FET 142 acts as a pseudo-resistor with an effective resistance $R_C$ that varies with $I_C$, namely $R_C = V_{CONSTANT}/I_C$. Thus, the first NMOS FET 142 acts as a center-frequency controlled resistor. Because the second NMOS FET 144 is controlled by the same bias voltage as the first NMOS FET 142, the second NMOS FET 144 mirrors the behavior of the first NMOS FET 142 and also acts as a center-frequency controlled resistor with effective resistance $R_C$. However, in some examples, the second NMOS FET 144 is controlled by a bias voltage that is proportional to, but not the same as, the voltage that controls the first NMOS FET 142. Accordingly, because $I_C$ increases with increasing center frequency $F_C$, the effective resistance $R_C$ of the second NMOS FET 144 decreases with increasing center frequency $F_C$. Conversely, the effective resistance $R_C$ of the second NMOS FET 144 increases with decreasing clock signal 302 frequency $F_C$. Thus, the compensation network 150 is adjusted to match the center frequency $F_C$.

If the first CP switch 116 is activated to close and conduct, node A 134 receives $I_C$ from the PFD and CP 138. This charges the first and second compensation capacitors 146 and 148 using the center-frequency dependent current $I_C$. Because $I_C$ increases and $R_C$ decreases as $F_C$ increases, the first and second compensation capacitors 146 and 148 charge more quickly as $F_C$ increases. Accordingly, the voltage at node A 134 $V_A$ is increased more quickly by current flowing from the PFD and CP 138 as $F_C$ increases.

If the second CP switch 128 is activated to close and conduct, current flows from node A 134 to the center-frequency dependent current source 132b towards ground 136. This discharges the first and second compensation capacitors 146 and 148 using the center-frequency dependent current $I_C$. Because $I_C$ increases and $R_C$ decreases as $F_C$ increases, the first and second compensation capacitors 146 and 148 discharge more quickly as $F_C$ increases. Accordingly, the voltage at node A 134 $V_A$ is decreased more quickly by current flowing towards the PFD and CP 138 as $F_C$ increases.

The change in charge at node A during one cycle of the clock signal 302 is given by Equation 4, where $\phi$ is the phase difference between the clock signal 302 and the feedback signal 304:

$$\text{change in charge at node } A = I_C \times \phi / F_{CLK} \qquad \text{Equation 4}$$

Equation 4 can be restated using Equation 3 to explicitly show dependency on the center frequency $F_C$, as shown in Equation 5:

$$\text{change in charge at node } A = \phi \times F_C / (m \times F_{CLK}) \qquad \text{Equation 5}$$

Because voltage equals charge divided by capacitance, the change in voltage at node A 134 per cycle of the clock signal 302 $\Delta V_A$ is given by Equation 6, where $C_{COMP}$ is the capacitance of the compensation network 150:

$$\Delta V_A = \phi \times F_C / (m \times F_{CLK} \times C_{COMP}) \qquad \text{Equation 6}$$

In the current controlled oscillator 194, when the first ramp switch 170 is open and not conducting, the first ramp capacitor 168 is charged by a current corresponding to a sum of the current $I_{gm}$ output by the first error amplifier output 158 plus the center-frequency dependent current $I_C$ from the center-frequency dependent current source 132e. When the first ramp switch 170 is closed and conducting, the anode plate of the first ramp capacitor 168 is shorted to ground 136, and the first ramp capacitor 168 discharges. When the second ramp switch 176 is open and not conducting, the second ramp capacitor 174 is charged by a current corresponding to a sum of the current $I_{gm}$ output by the second error amplifier output 160 plus the center-frequency dependent current $I_C$ from the center-frequency dependent current source 132*f*. When the second ramp switch 172 is closed and conducting, the anode plate of the second ramp capacitor 174 is shorted to ground 136, and the second ramp capacitor 176 discharges. Because the first ramp switch 170 is controlled by the non-inverting DFF output 184 of the third DFF 182, and the second ramp switch 176 is controlled by the inverting DFF output 186 of the third DFF 182, only one of the first and second ramp switches 170 and 176 is closed and conducting at a time during operation of the PLL 100. Accordingly, at a given time, one of the first and second ramp capacitors 168 and 174 is charging, while the other of the first and second ramp capacitors 168 and 174 is discharging or is discharged.

If the first ramp switch 174 is deactivated for a sufficient time period, voltage continues to charge the first ramp capacitor 168 to a level equaling $V_{REF}$, at which point the comparator 166 outputs a voltage corresponding to a logical one. This transition of the comparator 166 output to a logical one provides a rising edge to the clock input 180 of the third DFF 182. Because the first ramp switch 170 was deactivated, the non-inverting output 184 of the third DFF 182 was previously outputting a voltage corresponding to a logical zero. In some alternative examples, the ramp switches 170 and 176 are activated by a voltage corresponding to a logical zero. This logical zero was inverted to a logical one by the inverter 188, so that the data input 190 of the third DFF 182 was receiving a voltage corresponding to a logical one when the comparator 166 began to output a logical one. Accordingly, the third DFF 182 latches the logical one received by the data input 190. A voltage corresponding to the latched logical one is output by the non-inverting output 184, so that the data input 190 receives a voltage corresponding to a logical zero from the output of the inverter 188.

Additionally, the first ramp switch 170 activates and closes to conduct in response to the control input of the first ramp switch 170 receiving a logical one. This discharges the first ramp capacitor 168, so that the first non-inverting comparator input 166 no longer receives a voltage equal to $V_{REF}$. As a result, the comparator 166 outputs a voltage corresponding to a logical zero. Also, a voltage corresponding to an inverse of the latched logical one—a logical zero—is output by the inverting output 186, which deactivates the second ramp switch 176 to open and cease conducting. Accordingly, the second ramp capacitor 174 begins charging. Signal timings of the first and second ramp capacitors 168 and 174, the comparator 166, and the third DFF 182 are further described with respect to FIG. 3B.

The first ramp capacitor 168 and the second ramp capacitor 174 receive separate currents so that one of the ramp capacitors 168 or 174 can charge while the other ramp capacitor 168 or 174 is discharging. This facilitates improved accuracy, such as at higher frequencies, when a discharge time may constitute a larger portion of a charge-discharge cycle of the ramp capacitor 168 or 174.

The current $I_{RAMP}$, used to ramp the respective voltages across the first and second ramp capacitors 168 and 174, equals the sum of the (positive or negative) current $I_{gm}$ output by the error amplifier 152 to the first error amplifier output 158 and the center-frequency dependent current/c from the center-frequency dependent current source 132*e*, as shown in Equation 7:

$$I_{RAMP}=I_C+I_{gm} \quad \text{Equation 7}$$

Figure 3A:
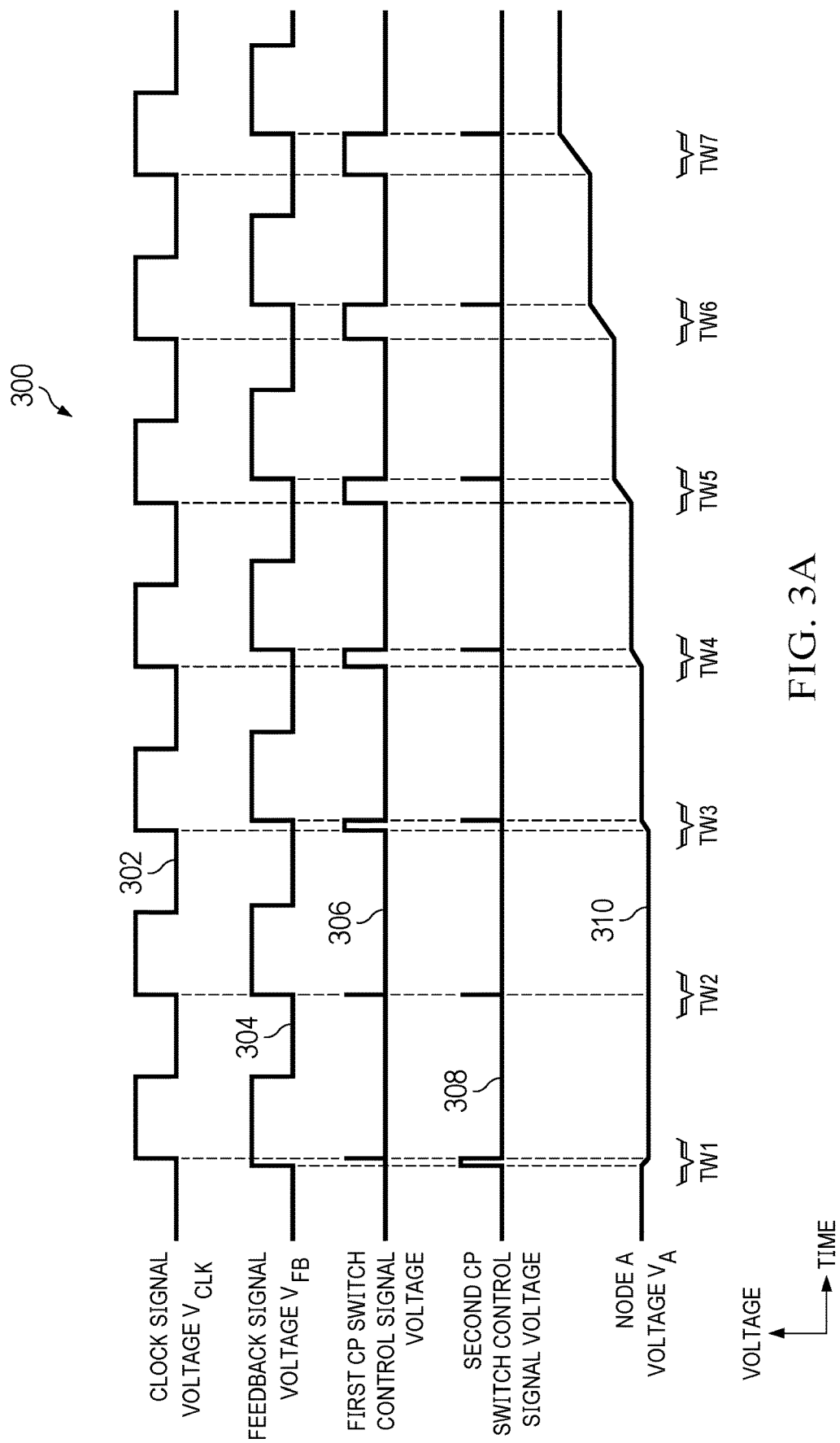
FIG. 3A shows a timing plot for example signals received and generated by the phase frequency detector (PFD) and charge pump (CP) and node A of the PLL of FIG. 1.
Figure 3B:
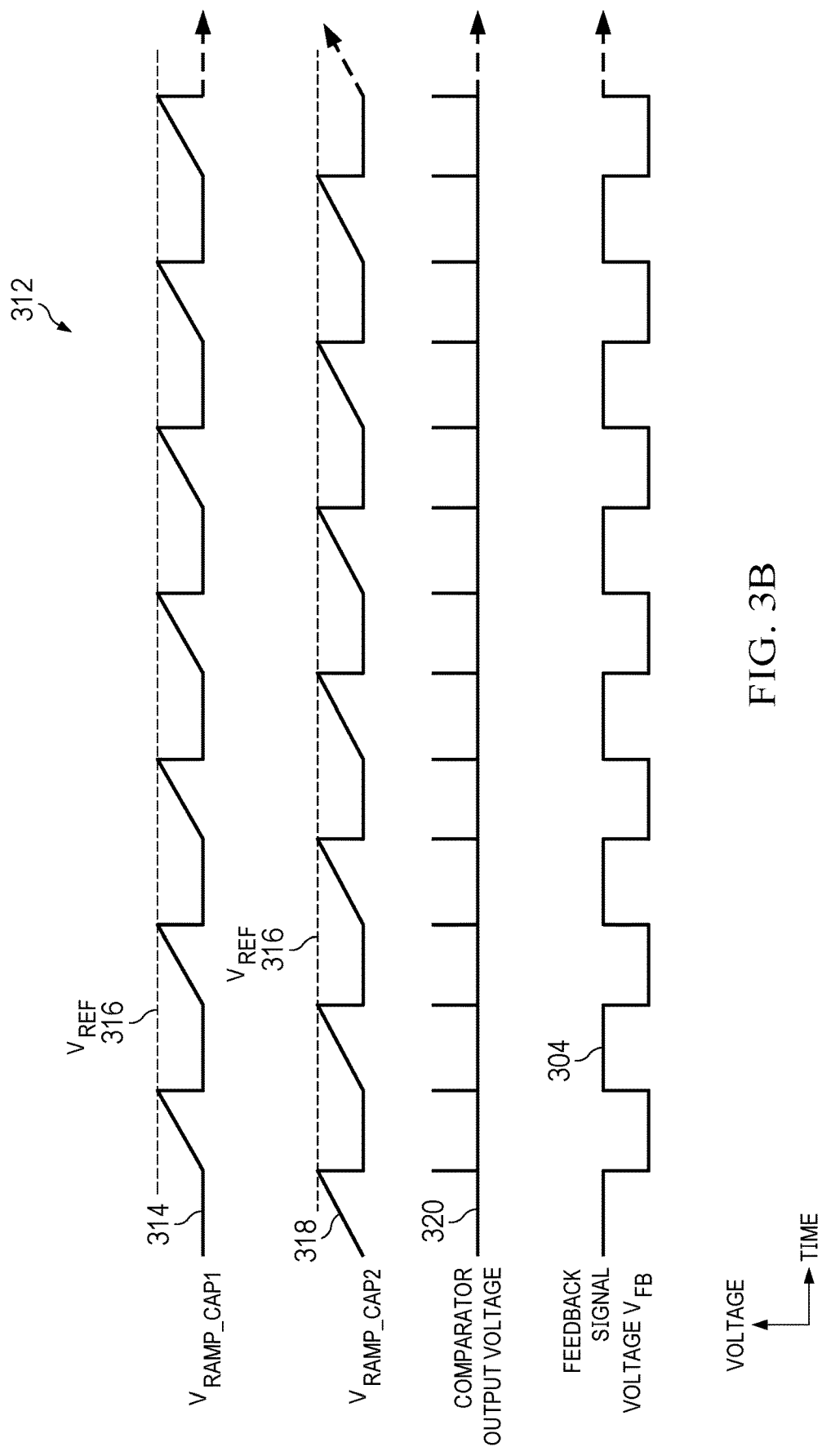
FIG. 3B shows a timing plot for example signals received and generated by the current controlled oscillator of the PLL of FIG. 1.

The output frequency $F_{FB}$ of the PLLs 100 is dependent on a ramp rate of the first and second ramp capacitors 168 and 174, as further described with respect to FIG. 3B. Accordingly, $F_{FB}$ is given by Equation 8, which can be rewritten using Equation 3 as Equation 9:

$$F_{FB}F_C\times(I_C+I_{gm})/I_C \quad \text{Equation 8}$$

$$F_{FB}=m\times(I_C+I_{gm})=F_C+m\times I_C \quad \text{Equation 9}$$

Equation 9 shows that the maximum and minimum values of $I_{gm}$ that can be generated by the transconductance stage 162, as described with respect to Equation 2, similarly limit the maximum and minimum values of $F_{FB}$ to which the PLL 100 can synchronize. These limits define the bandwidth of the PLL 100. Further, as described with respect to Equation 2, the limits on $I_{gm}$ are defined as a proportion of $I_C$, and do not change dynamically with respect to, for example, the clock signal 302 frequency $F_{CLK}$. Equation 10 shows the resulting limits on $F_{FB}$:

$$F_C\times(1-k)\leq F_{FB}\leq F_C\times(1+k) \quad \text{Equation 10}$$

For example, if k is 0.66, then the bandwidth of the PLL 100 ranges from $0.33\times F_C$ to $1.66\times F_C$.

The center-frequency dependent current $I_C$ is constant during normal operation of the PLL 100. Thus, the change in the current used to ramp the respective voltages across the first and second ramp capacitors 168 and 174 per clock cycle of the clock signal 302 equals the change $\Delta I_{gm}$ in $I_{gm}$ per cycle of the clock signal 302. The transconductance gm of the transconductance stage 162 equals the change in the output current $\Delta I_{gm}$ of the transconductance stage 162 divided by the change in the differential input voltage $\Delta(V_A-V_{REF})$ of the transconductance stage 162. $V_{REF}$ is constant. Accordingly, $\Delta I_{gm}$ is given in Equation 11 as a function of the transconductance $g_m$ of the transconductance stage 162 and the change in node A 134 voltage $\Delta V_A$ per clock cycle of the clock signal 302:

$$\Delta I_{gm}=g_m\times\Delta V_A \quad \text{Equation 11}$$

$\Delta I_{gm}$ can be expressed in terms of the center frequency $F_C$, the phase difference $\phi$ between the clock signal 302 and the feedback signal 304, and the clock signal 302 frequency $F_{CLK}$ by substituting Equations 1, 3, and 6 into Equation 11 to produce Equation 12:

$$\Delta I_{gm}=\phi\times n\times F_C^2/(m^2\times F_{CLK}\times C_{COMP}) \quad \text{Equation 12}$$

Accordingly, Equations 9 and 12 show that the output frequency of the PLL 100 $F_{FB}$ changes, in each cycle of the clock signal 302, by an amount proportional to the phase difference between the clock signal 302 and the feedback signal 304, and to the center frequency. m, n, and $C_{COMP}$ are constants, and the magnitude of the $F_C/F_{CLK}$ term is limited by the constant k, as described with respect to Equation 2.

FIG. 3A shows a timing plot 300 for example signals received and generated by the PFD and CP 138 and node A 134 of the PLL 100 of FIG. 1. The vertical axis represents voltage, and the horizontal axis represents time. The input clock terminal 112 has a clock signal 302 with voltage $V_{CLK}$, frequency $F_{CLK}$, and period $P_{CLK}$ ($1/F_{CLK}$). The feedback signal 304 has a voltage $V_{FB}$, frequency $F_{FB}$, and period $P_{FB}(1/F_{FB})$. In the example of FIG. 3A, $P_{FB}=1.1\times P_{CLK}$, so that $1.1\times F_{FB}=F_{CLK}$. For simplicity, the frequencies of the clock signal 302 and the feedback signal 304 as shown in FIG. 3A do not change, as they would from cycle to cycle of the clock signal 302, if applied to the PLL 100.

The first DFF output 110 outputs a first CP switch control voltage 306. The second DFF output 126 outputs a second CP switch control voltage 308. The PFD and CP 138 charges a voltage $V_A$ 310 at node A 134 if the first CP switch 116 is activated to conduct, and discharges the voltage $V_A$ 310 at node A 134 if the second CP switch 128 is activated to conduct. As previously described, the first and second CP switches 116 and 128 cannot be activated to conduct at the same time.

In a first time window TW1, the feedback signal 304 has a rising edge prior to the clock signal 302, thereby clocking the second DFF 118 before the first DFF 102. This causes the second CP switch control voltage 308 to correspond to a logical one until the clock signal 302 has a rising edge. While the second CP switch control voltage 308 corresponds to a logical one, the second CP switch 128 is activated, discharging the voltage $V_A$ 310 at node A 134. When the center frequency $F_C$ is higher, the voltage $V_A$ 310 at node A 134 discharges more quickly, so that the slope of $V_A$ 310 while discharging is steeper, e.g., in the present example is more negative. Conversely, when the center frequency $F_C$ is lower, the voltage $V_A$ 310 at node A 134 discharges more slowly, so that the slope of $V_A$ 310 while discharging is shallower, e.g., is less negative in the present example.

The rising edge of the clock signal 302 rising edge results in the AND logical gate 114 outputting a logical one, causing the outputs of both the first and second DFFs 102 and 118 to reset to a value corresponding to logical zero. The outputs of the first and second DFFs 102 and 118 are, respectively, the first and second CP switch control signal voltages 306 and 308. Accordingly, the second CP switch control signal voltage 308 corresponding to logical zero deactivates the second CP switch 116, which ceases to conduct, so that the voltage $V_A$ 310 at node A 134 ceases to discharge.

In a second time window TW2, the clock signal 302 and the feedback signal 304 each have a rising edge at the same time. This results in the AND logical gate 114 outputting a logical one, causing the outputs of both the first and second DFFs 102 and 118 to reset to a value corresponding to logical zero. Accordingly, the first and second CP switches remain nonconductive, and no change occurs in the voltage $V_A$ 310 at node A 134.

In third and subsequent time windows TW3, TW4, TW5, TW6, and TW7, the clock signal 302 has a rising edge prior to the feedback signal 304. This causes the first CP switch control voltage 306 to correspond to a logical one until the feedback signal 304 has a rising edge. While the first CP switch control voltage 306 corresponds to a logical one, the first CP switch 116 is activated, charging the voltage $V_A$ 310 at node A 134. When the center frequency $F_C$ is higher, the voltage $V_A$ 310 at node A 134 charges more quickly, so that the slope of $V_A$ 310 while charging is steeper (e.g., in the present example, is more positive). Conversely, when the center frequency $F_C$ is lower, the voltage $V_A$ 310 at node A 134 charges more slowly, so that the slope of $V_A$ 310 while charging is shallower (e.g., is less positive).

The rising edge of the feedback signal 304 results in the AND logical gate 114 outputting a logical one, causing the outputs of both the first and second DFFs 102 and 118 to reset to a value corresponding to logical zero. This deactivates the first CP switch 116, which ceases to conduct, so that the voltage $V_A$ 310 at node A 134 ceases to charge.

FIG. 3B shows a timing plot 312 as an example of signals received and generated by the current controlled oscillator 194 of the PLL 100 of FIG. 1. While the feedback signal 304 voltage $V_{FB}$ corresponds to a logical zero, so that the first ramp switch 170 is deactivated, a voltage across the first ramp capacitor 168 $V_{RAMP\_CAP1}$ 314 is charged by a sum of the current $I_{gm}$ output by the error amplifier 152 to the first error amplifier output 158, and the center-frequency dependent current $I_C$ (from the center-frequency dependent current source 132e). $V_{RAMP\_CAP1}$ 314 is received by the first non-inverting comparator input 164. When $V_{RAMP\_CAP1}$ 314 reaches $V_{REF}$ 316, which is the voltage received by the inverting comparator input 178, a comparator output voltage 320, output by the comparator 166 to the clock input 180 of the third DFF 182, changes state from a voltage corresponding to a logical zero (indicating the first and second comparator inputs 164 and 172 are not the same) to a voltage corresponding to a logical one (indicating the first and second comparator inputs 164 and 172 are the same). This causes the non-inverting output 184 of the third DFF 182 to change state, generating a rising edge (in some examples, a falling edge) in the feedback signal 304 voltage $V_{FB}$, and activating the first ramp switch 170. The activated first ramp switch 170 couples the anode plate of the first ramp capacitor 168 to ground 136, discharging the first ramp capacitor 168. This causes the first non-inverting comparator input 164 and the inverting comparator input 178 to be different, so that the comparator output voltage 320 changes state to a voltage corresponding to a logical zero.

While the feedback signal 304 voltage $V_{FB}$ corresponds to a logical one, so that the second ramp switch 170 is deactivated, a voltage across the second ramp capacitor 174 $V_{RAMP\_CAP2}$ 318 is charged by a sum of the current $I_{gm}$ output by the error amplifier 152 to the second error amplifier output 160, and the center-frequency dependent current $I_C$ (from the center-frequency dependent current source 132f). $V_{RAMP\_CAP2}$ 314 is received by the second non-inverting comparator input 172. When $V_{RAMP\_CAP2}$ 314 reaches $V_{REF}$ 316, the comparator output voltage 320 changes state from the voltage corresponding to a logical zero to the voltage corresponding to a logical one. This causes the non-inverting output 184 of the third DFF 182 to change state, generating a falling edge (in some examples, a rising edge) in the feedback signal 304 voltage $V_{FB}$, and activating the second ramp switch 176. The activated second ramp switch 176 couples the anode plate of the second ramp capacitor 174 to ground 136, discharging the second ramp capacitor 174. This causes the second non-inverting comparator input 172 and the inverting comparator input 178 to be different, so that the comparator output voltage 320 changes state to the voltage corresponding to a logical zero.

Changing the current $I_{gm}$ output by the transconductance stage 162 changes a ramp rate of the first and second ramp capacitors 168 and 174. If the sum of $I_{gm}$ and $I_C$ increases, a ramp capacitor 168 or 174 ramps more quickly, so that a voltage across the ramp capacitor 168 or 174 reaches $V_{REF}$ more quickly. This shortens a corresponding half-period of the feedback signal 304, which increases $F_{FB}$. Similarly, if the sum of $I_{gm}$ and $I_C$ decreases, the ramp capacitor 168 or 174 ramps less quickly, so that a voltage across the ramp capacitor 168 or 174 reaches $V_{REF}$ less quickly, lengthening a corresponding half-period of the feedback signal 304, which decreases $F_{FB}$. As described above, the center-frequency dependent current $I_C$ increases or decreases proportionally to the center frequency of the PLL 100 $F_C$ (see Equation 3).

The error amplifier 152 uses the voltage differential between $V_A$ and $V_{REF}$ to generate a current at the first and second error amplifier outputs 158 and 160. As described above, the voltage at node A 134 $V_A$ charges and discharges more or less rapidly proportionally to the phase difference between the clock signal 302 and the feedback signal 304. The cumulative effect on the voltage at node A 134 is configured so that a given phase difference between the clock signal 302 (received via the input clock terminal 112) and the feedback signal 304 causes an approximately-same voltage change to be applied to the voltage at node A 134 $V_A$ per clock cycle of the clock signal 302, with a relatively small adjustment from the $F_C/F_{CLK}$ term. The adjustment is relatively small because the difference between the center frequency $F_C$ and a clock signal 302 frequency $F_{CLK}$ to which the PLL 100 synchronizes is limited by the constant k described with respect to Equation 2.

Further, the transconductance $g_m$ of the transconductance stage 162 is center-frequency dependent, increasing or decreasing proportionally to $F_C$. The transconductance $g_m$ of the transconductance stage 162 is configured so that, for different center frequencies $F_C$ of the PLL 100, a given voltage change at node A 134 $V_A$ causes an approximately-same proportional frequency change x % of the output signal frequency of the PLL 100 $F_{FB}$ per clock cycle of the clock signal 302. (The percentage x % can also be expressed as a fraction that is less than one. Approximately-same references the previously described relatively small shift applied by the $F_C/F_{CLK}$ term.) This means that, for a center frequency $F_C$ of the PLL 100, a given phase difference between the clock signal 302 and the feedback signal 304 causes an approximately-same proportional frequency change x % of the output signal frequency $F_{FB}$ of the PLL 100 $F_{FB}$ per clock cycle of the clock signal 302.

The proportional frequency change x % of the output signal frequency $F_{FB}$ of the PLL 100 $F_{FB}$ per clock cycle of the clock signal 302 is limited by the amount of current $I_{gm}$ that the error amplifier 152 can push or pull—the positive or negative current output by the error amplifier 152. As explained with respect to Equations 7 through 12, the amount of current that the error amplifier 152 can push or pull corresponds to the adjustment the error amplifier 152 can make to the current received by the first and second ramp capacitors 168 and 174, and accordingly, the total charge received by the first and second ramp capacitors 168 and 174 per clock cycle.

Accordingly, the PLL 100 changes its output signal frequency $F_{FB}$ at a rate that is proportionally constant for same input signal phase differences φ (herein, constant means constant within design parameters and within manufacturing tolerances, as modulated by the $F_C/F_{CLK}$ term). Also, at higher center frequencies $F_C$, the PLL 100 adjusts its output signal frequency $F_{FB}$ more quickly, and at lower center frequencies $F_C$, the PLL 100 adjusts its output signal frequency $F_{FB}$ more slowly.

The bandwidth of the PLL 100 is a range of output signal frequencies $F_{FB}$ around the specified center frequency $F_C$ that the PLL 100 can generate. The range of frequencies that the PLL 100 can generate is limited, as discussed with respect to Equations 2 and 7 through 10, to prevent the PLL 100 from operating outside a range of stable response.

Figure 4:
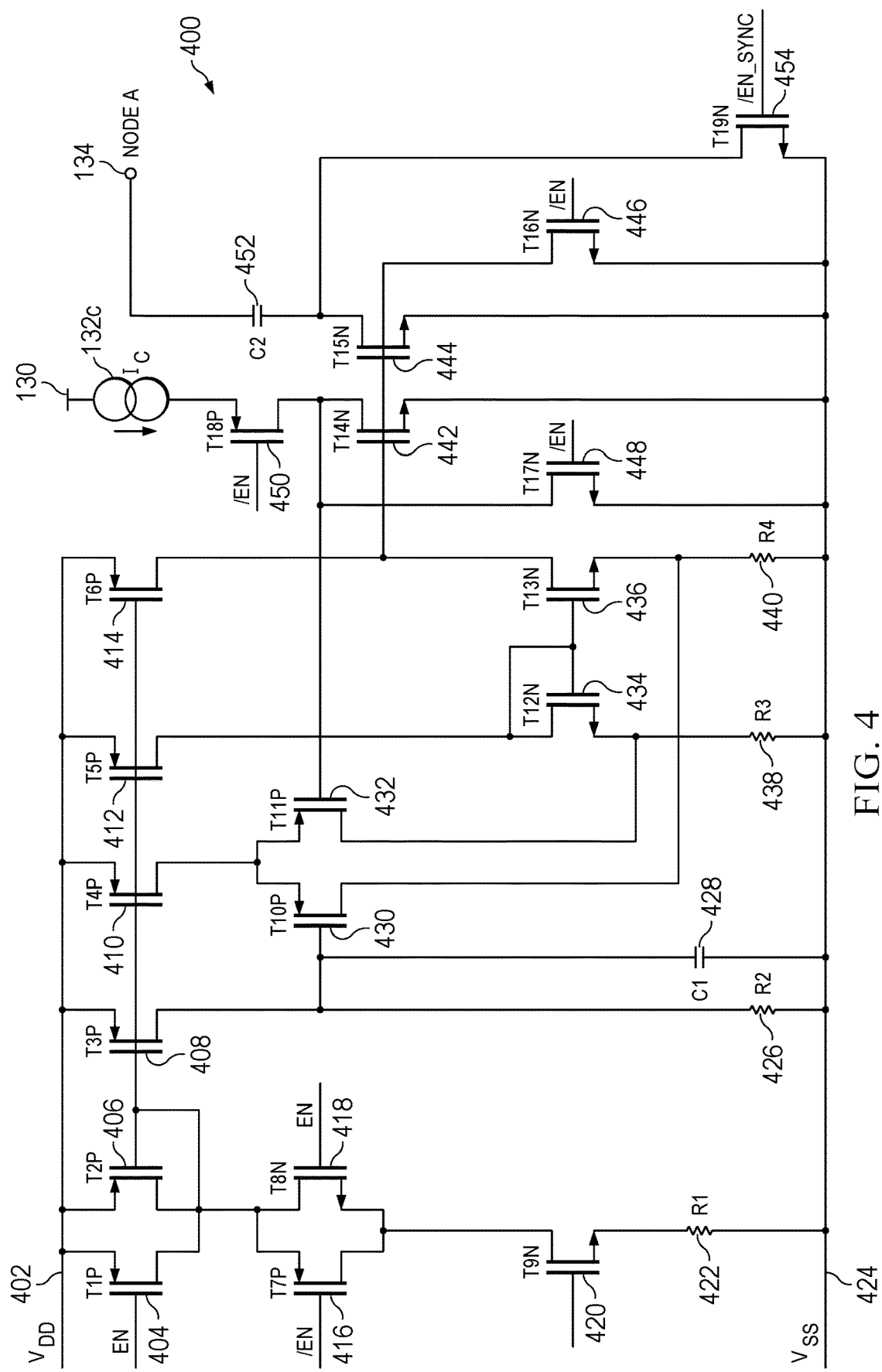
FIG. 4 shows a circuit diagram for an example compensation network and circuitry for determining the center-frequency dependent resistance $R_C$, for use in the PLL of FIG. 1.

FIG. 4 shows a circuit diagram 400 for an example compensation network 150 and circuitry for determining the center-frequency dependent resistance Re, for use in the PLL 100 of FIG. 1. In FIGS. 4 and 5, for simplicity and clarity, transistors are given a name comprised of "T[number][channel type]". A high voltage reference 402 (relative to a voltage reference 424) is referred to herein as $V_{DD}$ 402. A low voltage reference 424 (relative to voltage reference 402) is referred to herein as $V_{SS}$ 424. In some examples, $V_{SS}$ 424 corresponds to ground 136. The compensation network 150 also includes a p-channel MOSFET T1P 404, a p-channel MOSFET T2P 406, a p-channel MOSFET T3P 408, a p-channel MOSFET T4P 410, a p-channel MOSFET T5P 412, a p-channel MOSFET T6P 414, a p-channel MOSFET T7P 416, an n-channel MOSFET T8N 418, an n-channel MOSFET T9N 420, a first resistor R1 422, a second resistor R2 426, a first capacitor C1 428, a p-channel MOSFET T10P 430, a p-channel MOSFET T11P 432, an n-channel MOSFET T12N 434, an n-channel MOSFET T13N 436, a third resistor R3 438, a fourth resistor R4 440, an n-channel MOSFET T14N 442, an n-channel MOSFET T15N 444, an n-channel MOSFET T16N 446, an n-channel MOSFET T17N 448, a p-channel MOSFET T18P 450, a second capacitor C2 452, and an n-channel MOSFET T19N 454.

The high voltage reference 402 is connected to a source of T1P 404, a source of T2P 406, a source of T3P 408, a source of T4P 410, a source of T5P 412, and a source of T6P 414. A gate of T1P 404 receives an enable signal (EN). A drain of T1P 404 is connected to a drain of T2P 406, to the gate of T2P 406, to the gate of T3P 408, to the gate of T4P 410, to the gate of T5P 412, to the gate of T6P 414, to the source of T7P 416, and to the drain of T8N 418. A gate of T7P 416 is connected to receive an inverted enable signal (/EN); for example, from an inverter (not shown). A gate of T8N 418 is connected to receive the enable signal (EN). A drain of T7P 416 and a source of T8N 418 are connected to a drain of T9N 420. A gate of T9N 420 is connected to receive a constant bias voltage. A source of T9N 420 is connected to a first terminal of R1 422. A second terminal of R1 422 is connected to the low voltage reference 424 with voltage Vss.

A drain of T3P 408 is connected to a first terminal of R2 426, a first plate of C1 428, and to a gate of T10P 430. A second terminal of R2 426 is connected to $V_{SS}$ 424. A second plate of C1 428 is connected to $V_{SS}$ 424. A drain of T4P 410 is connected to a source of T10P 430 and a source of T11P 432.

A drain of T5P 412 is connected to a drain and a gate of T12N 434, and to a gate of T13N 436. A source of T12N 434 is connected to a drain of T11P 432 and to a first terminal of R3 438. A second terminal of R3 438 is connected to $V_{SS}$ 424. A drain of T10P 430 is connected to a source of T13N 436 and to a first terminal of R4 440. A drain of T6P 414 is connected to a drain of T13N 436, a gate of T14N 442, a gate of T15N 444, and a drain of T16N 446. T14N 442 corresponds to the first NMOS FET 142 and T15N 444 corresponds to the second NMOS FET 144 in FIG. 1. A second terminal of R4 440 is connected to $V_{SS}$ 424.

A gate of T11P 432 is connected to a drain of T17N 448, a drain of T18P 450, and a drain of T14N 442. A source of T14N 442, a source of T15N 444, a source of T16N 446, and a source of T17N 448 are each connected to $V_{SS}$ 424. A gate of T16N 446 and a gate of T17N 448 are each connected to receive the inverted enable signal (/EN). The voltage input 130 is connected to the input of the center-frequency dependent current source 132c (see FIG. 1). The output of the center-frequency dependent current source 132c is connected to a source of T18P 450. A gate of T18P 450 is connected to receive and be biased by the inverted enable signal (/EN).

A gate of T15N 444 is connected to a second plate of a second capacitor C2 452 and a drain of an n-channel MOSFET T19N 454. A first plate of C2 452 is connected to node A 134 (FIG. 1). A capacitance of C2 452 corresponds to the first compensation capacitor 146, and a parasitic capacitance of C2 452 corresponds to the second compensation capacitor 148. A gate of T19N 454 is connected to receive and be biased by an inverted (inverted by, for example, an inverter, which is not shown) synchronization signal (/EN_SYNC).

FIG. 5 shows a circuit diagram for an example transconductance stage 162 for use in the PLL 100 of FIG. 1. A high voltage reference 402 receives a voltage $V_{DD}$ 402, and a low voltage reference 424 has voltage $V_{SS}$ 424. The transconductance stage 162 also includes center-frequency dependent current source 132d, p-channel MOSFET T27P 502, p-channel MOSFET T28P 504, p-channel MOSFET T29P 506, p-channel MOSFET T30P 508, n-channel MOSFET T31N 510, n-channel MOSFET T32N 512, n-channel MOSFET T33N 514, n-channel MOSFET T34N 516, p-channel MOSFET T35P 518, p-channel MOSFET T36P 520, n-channel MOSFET T37N 522, p-channel MOSFET T38P 526, p-channel MOSFET T39P 528, n-channel MOSFET T40N 530, and n-channel MOSFET T41N 532. T28P 504 and T29P 506 form a PMOS current mirror 534. T32N 512 and T41N 532 form an NMOS current mirror 536.

$V_{DD}$ 402 is connected to a source of T27P 502, a source of T28P 504, a source of T29P 506, and a source of T30P 508. A gate of T27P 502 is connected to receive, and T27P 502 is biased by, the enable signal (EN). A drain of T27P 502 is connected to the gates of T28P 504, T29P 506, and T30P 508, and is connected to the drains of T28P 504 and of T31N 510. A drain of T29P 506 is connected to a drain of T32N 512, and to the first error amplifier output 158. A drain of T30P 508 is connected to a drain of T33N 514, and to the second error amplifier output 160. A source of T32N 512 and a source of T33N 514 are connected to the low voltage reference 434 that has voltage $V_{SS}$ 424.

A gate of T31N 510 is connected to a gate and a drain of T34N 516, a drain of T35P 518, a drain of T36P 520, and a drain of T37N 522. A source of T31N 510, a source of T34N 516, and a source of T37N 522 are each connected to $V_{SS}$ 424. A gate of T35P 518 and a gate of T36P 520 are connected to be biased by $V_{REF}$, and together correspond to the inverting input 154 of the error amplifier 152.

The voltage input 130 is connected to an input of the center-frequency dependent current source 132d. The center-frequency dependent current source 132d has a first center-frequency dependent current source output 5241 and a second center-frequency dependent current source output 5242. The first and second center-frequency dependent current source outputs 5241 and 5242 are mutually electrically isolated. The first center-frequency dependent current source output 5241 is connected to a source of T35P 518 and a source of T38P 526. The second center-frequency dependent current source output 5242 is connected to a source of T36P 520 and a source of T39P 528.

A gate of T38P 526 and a gate of T39P 528 are connected to node A 134, and together correspond to the non-inverting input 156 of the error amplifier 152. Accordingly, T38P 526 and T39P 528 are connected to be biased by the voltage at node A 134 $V_A$. A drain of T38P 526 is connected to a drain of T39P 528, a drain of T40N 530, a drain and a gate of T41N 532, a gate of T32N 512, and a gate of T33N 514. A gate of T37N 522 and a gate of T40N 530 are each connected to receive and be biased by the inverted enable signal (/EN). A source of T40N 530 and a source of T41N 532 are each connected to $V_{SS}$ 424.

T35P 518, T36P 520, T38P 526, and T39P 528 form a differential pair, so that they generate an output in response to a differential between the bias voltage $V_{REF}$ for T35P 518 and T36P 520 and the bias voltage $V_A$ for T38P 526 and T39P 528. T35P 518, T36P 520, T38P 526, and T39P 528 are operated in a weak inversion region to linearize the transconductance gm curve of the error amplifier 152 as a function of the center frequency $F_C$ of the bandwidth of the PLL 100.

As described above, T28P 504 and T29P 506 form a PMOS current mirror 534, and T32N 512 and T41N 532 form an NMOS current mirror 536. The PMOS current mirror 534 and the NMOS current mirror 536 operate to define the transconductance gm, the lower current output limit $-k \times I_C$, and the upper current output limit $k \times I_C$ of the transconductance stage 162.

Modifications are possible in the described embodiments, and other embodiments are possible, within the scope of the claims.

In some examples, memory circuits (such as flip flops or latches) are used that change state in response to a clock signal 302 portion other than a rising edge.

In some examples, a center-frequency dependent resistive element with a center-frequency dependent resistance other than a MOSFET is used.

In some examples, transistors other than MOSFETS can be used.

In some examples, capacitive elements other than polarized capacitors are used.

In some examples, a resistive element other than a resistor is used to define the center-frequency dependent current $I_C$ and, accordingly, the center frequency $F_C$ of the PLL 100. In some examples, a resistive element (such as a resistor or programmable resistor or resistor array) used to define $I_C$ is located in a same IC 206 as the PLL 100. In some examples, a resistive element used to define $I_C$ can be set by a software or hardware based process.

In some examples, PLLs 100 are used in power distribution, such as direct current/direct current transmission or energy storage; industrial transport, such as off-highway vehicles; video surveillance; ventilators or other medical equipment; audio recording or playback equipment or audio equipment control; digital cockpits; or automotive chargers.

In some examples, different ones of the center-frequency dependent current sources 132 generate currents with different magnitudes.

In some examples, the error amplifier 152 and the comparator 166 receive different reference voltages.

In some examples, the center-frequency dependent current source 132 has multiple mutually electrically isolated outputs, forming a bus.

In some examples, a single ramp capacitor is used.

In some examples, a target output signal frequency of the PLL 100 is a multiple of the input clock signal 302 frequency $F_{CLK}$. In some examples, this multiple is determined using a frequency divider.

In some examples, an equivalent resistance of the first NMOS FET 142 is a first multiple (or fraction) of a center-frequency dependent resistance $R_C$. In some examples, an equivalent resistance of the second NMOS FET 144 is a second multiple (or fraction) of the center-frequency dependent resistance $R_C$. In some examples, the first multiple (or fraction) is the same as, or different from, the second multiple (or fraction).

In some examples, a memory element other than a D flip flop is used.

In some examples, a relatively low reference voltage is used as the ground 136.

What is claimed is:
1. A phase locked loop (PLL) comprising:
a compensation circuit including:
a resistive element having a resistance responsive to a center frequency of a PLL bandwidth; and a capacitor circuit coupled to the resistive element;
a transconductance circuit including:
  a first current source having a first current source output, wherein the first current source is configured to provide a first current at the first current source output responsive to the center frequency; and
  an error amplifier having a reference input, first and second amplifier inputs and an amplifier output, wherein the first amplifier input is coupled to the first current source output, the second amplifier input coupled to the capacitor circuit, the error amplifier having a transconductance responsive to the center frequency, and the error amplifier is configured to receive a signal at the second amplifier input responsive to the resistance and to a difference between a clock signal and a feedback signal; and
an oscillator having an oscillator input and an oscillator output, wherein the oscillator is configured to provide a signal at the oscillator output for generating the feedback signal.

2. The PLL of claim 1, wherein the oscillator includes:
a second current source having a second current source output and configured to provide a second current at the second current source output responsive to the center frequency;
a comparator having first and second comparator inputs and a comparator output, wherein the first comparator input is coupled to a reference voltage terminal, and the second comparator input is coupled to the second current source output and to the amplifier output; and
a capacitor coupled to the second current source output.

3. The PLL of claim 1, wherein the oscillator is configured to change a frequency of the feedback signal at a rate that is a fraction of the center frequency per cycle of the clock signal, so that the fraction is the same for same values of a phase difference between the feedback signal and the clock signal at different values of the center frequency.

4. The PLL of claim 1, wherein the compensation circuit is configured so that a voltage change per cycle of the clock signal of the signal at the second amplifier input is the same for same values of a phase difference between the feedback signal and the clock signal at different values of the center frequency.

5. The PLL of claim 1, wherein the error amplifier is a first error amplifier, and the PLL is further comprising:
a voltage input terminal;
a second error amplifier having third and fourth amplifier inputs and a second amplifier output;
a constant voltage source having a constant voltage output coupled to the third amplifier input; and
a first transistor having a first control terminal and first and second current terminals, wherein the first current terminal is coupled to the fourth amplifier input, and the second current terminal is coupled to a ground terminal;
wherein the resistive element is a second transistor having a second control terminal, in which the second control terminal is coupled to the first control terminal and to the second amplifier output.

6. The PLL of claim 1, wherein the oscillator includes first and second ramp capacitors, wherein the first ramp capacitor is configured to charge in response to a voltage at the oscillator output being relatively high, and to discharge in response to the voltage at the oscillator output being relatively low, the second ramp capacitor is charged in response to the voltage at the oscillator output being relatively low and discharged in response to the voltage at the oscillator output being relatively high, and the oscillator is configured to switch between providing the relatively low voltage and providing the relatively high voltage at the oscillator output in response to either the first or the second ramp capacitor having a voltage that is at least as high as a reference voltage.

7. The PLL of claim 1, wherein the transconductance circuit is configured so that $-k \times I_C \leq I_{gm} \leq k \times I_C$, wherein k is a constant, $I_C$ is the first current, and $I_{gm}$ is a current provided at the amplifier output.

8. The PLL of claim 1, wherein the transconductance and the constant k are determined using one or more current mirrors included in the transconductance circuit.

9. A phase locked loop (PLL) comprising:
a current source having a current input and a current output, wherein the current source is configured to output a current at the current output having a magnitude $I_C$ dependent on a center frequency $F_C$ of a PLL bandwidth;
a phase frequency detector (PFD) and charge pump (CP) having a clock input, a feedback input, and a CP output, wherein the PFD and CP is configured to receive a clock signal having frequency $F_{CLK}$ at the clock input and to receive a feedback signal at the feedback input, the PFD and CP is configured to couple the CP output to the current output or to a ground terminal responsive to a phase difference between the clock signal and the feedback signal;
a compensation network having a compensation input and including a capacitive element and a resistive element, wherein the resistive element has a resistance dependent on $F_C$;
a transconductance stage having a transconductance input and a transconductance output, wherein the transconductance input is coupled to the CP output and the compensation input, and the transconductance stage has a transconductance dependent on $F_C$ and is configured to provide a current with magnitude $I_{gm}$;
a current controlled oscillator having an oscillator input and an oscillator output, wherein the oscillator input is coupled to the transconductance output and to the current output, the oscillator output is coupled to the feedback input, and the oscillator is configured to generate the feedback signal with a frequency $F_{FB}$ responsive to $I_C$ and $I_{gm}$; and
a voltage input terminal configured to receive an input voltage;
an error amplifier having first and second amplifier inputs and an amplifier output;
a constant voltage source having a constant voltage output coupled to the first amplifier input; and
a first transistor having first and second current terminal and a first control terminal, wherein the first current terminal is coupled to the voltage input terminal, the second current terminal is coupled to the ground terminal and to the second amplifier input;
wherein the resistive element is a second transistor having a second control terminal, and the second control terminal is coupled to the first control terminal and to the amplifier output.

10. The PLL of claim 9, wherein the current controlled oscillator is configured to change $F_{FB}$ at a rate that is a fraction of $F_C$ per cycle of the clock signal, so that the fraction is the same for same values of the phase difference at different values of $F_C$.

11. The PLL of claim 9, wherein a PFD of the PFD and CP includes the clock input, the feedback input, a first PFD output, a second PFD output, and a reset input, wherein the reset input is asserted after both the clock signal and the feedback signal have a voltage corresponding to the CP output being coupled to both the current output and to the ground terminal.

12. The PLL of claim 11, wherein a CP of the PFD and CP includes a first CP control input, a second CP control input, a first current input, a second current input, and the CP output, in which the first CP control input is coupled to the first PFD output, and the second CP control input is coupled to the second PFD output.

13. The PLL of claim 9, wherein a voltage at the transconductance input is configured to be charged or discharged by the PFD and CP in response to the phase difference and at a rate per clock cycle of the clock signal responsive to the resistance.

14. The PLL of claim 13, wherein the transconductance stage is configured to provide the current with magnitude $I_{gm}$ in response to the transconductance and a voltage at the transconductance input.

15. The PLL of claim 9, wherein the current controlled oscillator includes first and second ramp capacitors, wherein the first ramp capacitor is configured to charge in response to a voltage at the oscillator output being relatively high and to discharge in response to the voltage at the oscillator output being relatively low, the second ramp capacitor is charged in response to the output voltage being relatively low and discharged in response to the output voltage being relatively high, and the current controlled oscillator is configured to switch between providing the relatively low voltage and providing the relatively high voltage in response to either the first ramp capacitor or the second ramp capacitor having a voltage that is at least as high as a reference voltage.

16. The PLL of claim 9, wherein the transconductance stage is configured so that $-k \times I_C \leq I_{gm} \leq k \times I_C$ for a constant k.

17. The PLL of claim 16, wherein the transconductance and the constant k are determined using one or more current mirrors included in the transconductance stage.

18. A clock controlled system comprising:
a phase frequency detector (PFD) and charge pump (CP) having an output and:
a first current source configured to provide a first current at a first current source output responsive to a center frequency of a PLL bandwidth;
a second current source configured to provide a second current at a second current source output responsive to the center frequency;
a first D flip flop (DFF) having a first DFF input and a first DFF output;
a second DFF having a second DFF input and a second DFF output, wherein the second DFF input is configured to receive an input clock signal; and
the PFD and CP configured to provide a third current at the output of the PFD and CP responsive to the first current, the second current, and a phase difference between the first DFF input and the second DFF input;
a compensation circuit including:
a resistive element having a resistance responsive to the center frequency; and
a capacitor circuit coupled to the resistive element;
a transconductance circuit including:
a third current source configured to provide a fourth current at a third current source output responsive to the center frequency; and
an error amplifier having a reference input, first and second amplifier inputs and an amplifier output, wherein the error amplifier has a transconductance responsive to the center frequency, the first amplifier input is coupled to the first current source output, the second amplifier input is coupled to the capacitor circuit, and the error amplifier is configured to receive a signal at the second amplifier input responsive to the third current and the resistance; and
an oscillator having an oscillator input and an oscillator output, wherein the oscillator input is coupled to the amplifier output, the oscillator output is coupled to the first DFF output, and the oscillator is configured to provide a signal at the oscillator a output for generating a feedback signal.

19. The PLL of claim 18, wherein the oscillator is configured to change a frequency of the feedback signal at a rate that is a fraction of the center frequency per cycle of the input clock signal, so that the fraction is the same for same values of the phase difference at different values of the center frequency.

20. The PLL of claim 18, wherein the compensation circuit is configured so that a voltage change at the second amplifier input per cycle of the input clock signal is the same for same values of the phase difference at different values of the center frequency.

* * * * *